US007630254B2

(12) United States Patent
Lutze

(10) Patent No.: US 7,630,254 B2
(45) Date of Patent: *Dec. 8, 2009

(54) STARTING PROGRAM VOLTAGE SHIFT WITH CYCLING OF NON-VOLATILE MEMORY

(75) Inventor: Jeffrey Lutze, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/018,279

(22) Filed: Jan. 23, 2008

(65) Prior Publication Data
US 2008/0137431 A1 Jun. 12, 2008

Related U.S. Application Data

(63) Continuation of application No. 11/144,264, filed on Jun. 3, 2005, now Pat. No. 7,339,834.

(51) Int. Cl.
G11C 11/34 (2006.01)
(52) U.S. Cl. ............................. 365/185.28; 365/185.19; 365/185.14
(58) Field of Classification Search ............ 365/185.28, 365/185.14, 185.19
See application file for complete search history.

(56) References Cited

U.S. PATENT DOCUMENTS

| 5,220,531 | A | 6/1993 | Blyth |
| 5,280,446 | A | 1/1994 | Ma |
| 5,412,601 | A | 5/1995 | Sawada |
| 5,712,815 | A | 1/1998 | Bill |
| 5,761,222 | A | 6/1998 | Baldi |
| 6,301,161 | B1 | 10/2001 | Holzmann |
| 6,646,926 | B2 | 11/2003 | Keays |
| 6,735,114 | B1 | 5/2004 | Hamilton |
| 6,738,289 | B2 | 5/2004 | Gongwer |
| 6,744,670 | B2 * | 6/2004 | Tamada et al. ......... 365/185.19 |
| 6,859,397 | B2 | 2/2005 | Lutze |
| 6,888,758 | B1 | 5/2005 | Hemink |
| 6,950,347 | B2 | 9/2005 | Kurata |
| 6,954,378 | B2 | 10/2005 | Tanaka |
| 6,970,384 | B2 | 11/2005 | Park |
| 2003/0107919 | A1 | 6/2003 | Yano |

(Continued)

FOREIGN PATENT DOCUMENTS

WO    WO96/41346    12/1996

(Continued)

OTHER PUBLICATIONS

U.S. Appl. No. 12/018,275, filed Jan. 23, 2008.

(Continued)

Primary Examiner—Amir Zarabian
Assistant Examiner—Anthan T Tran
(74) Attorney, Agent, or Firm—Vierra Magen Marcus & DeNiro LLP

(57) ABSTRACT

A system is disclosed for programming non-volatile storage that improves performance by setting the starting programming voltage to a first level for fresh parts and adjusting the starting programming voltage as the memory is cycled. For example, the system programs a set of non-volatile storage elements during a first period using an increasing program signal with a first initial value and subsequently programs the set of non-volatile storage elements during a second period using an increasing program signal with a second initial value, where the second period is subsequent to the first period and the second initial value is different than the first initial value.

14 Claims, 15 Drawing Sheets

U.S. PATENT DOCUMENTS

2004/0109362 A1\* 6/2004 Gongwer et al. ............ 365/200
2005/0083737 A1 4/2005 Okimoto
2007/0253256 A1\* 11/2007 Aritome ................ 365/185.24

FOREIGN PATENT DOCUMENTS

| WO | WO2005010869 | 2/2005 |
| WO | WO2005024939 | 3/2005 |
| WO | WO2005073975 | 8/2005 |

OTHER PUBLICATIONS

Taiwanese Office Action dated Feb. 3, 2009 in Taiwanese Patent Application No. 095119514.

International Search Report dated Apr. 19, 2007 in PCT Application No. PCT/US2006/020375.

Written Opinion of the International Searching Authority dated Apr. 19, 2007 in PCT Application No. PCT/US2006/020375.

Office Action dated Apr. 2, 2009 in U.S. Appl. No. 12/018,275.

Response to Office Action filed May 11, 2009 in U.S. Appl. No. 12/018,275.

Notice of Allowance dated Sep. 15, 2009, U.S. Appl. No.12/018,275, filed Jan. 23, 2008.

\* cited by examiner

|  | Typical Program Pulse Count | | | Vpgm | Typical Tprogram | Typical Soft Program Pulses |
| --- | --- | --- | --- | --- | --- | --- |
|  | Lower Page | Upper Page | Full Sequence |  |  |  |
| Fresh | 13 | 18 | 22 | 16.0V | 800 usec | 16 |
| 10k Cycles | 10 | 15 | 19 | 16.0V | 650 usec | 10 |

|  | Typical Program Pulse Count | | | Vpgm | Typical Tprogram | Typical Soft Program Pulses |
| --- | --- | --- | --- | --- | --- | --- |
|  | Lower Page | Upper Page | Full Sequence |  |  |  |
| Fresh | 10 | 15 | 19 | 16.9V | 650 usec | 16 |
| ~1k Cycles | 10 | 15 | 19 | 16.6V | 650 usec | 14 |
| ~3k Cycles | 10 | 15 | 19 | 16.3V | 650 usec | 12 |
| ~10k Cycles | 10 | 15 | 19 | 16.0V | 650 usec | 10 |

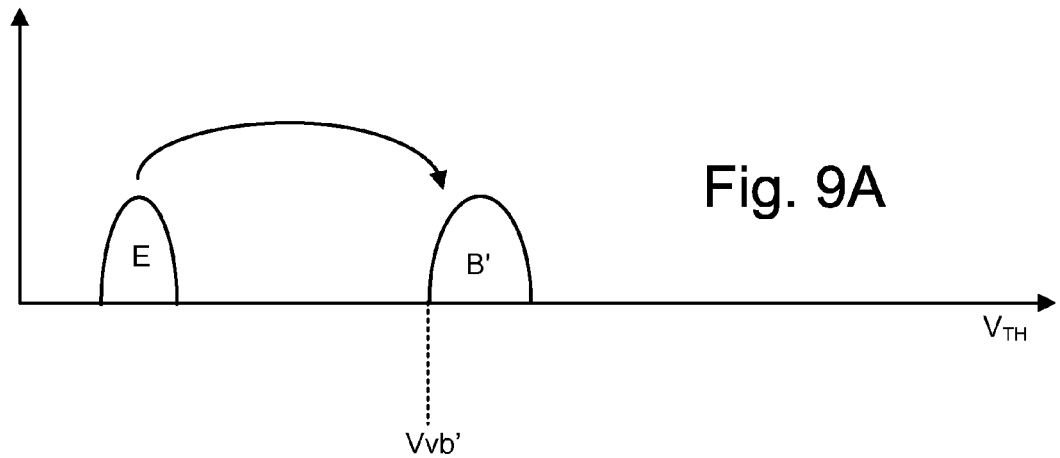
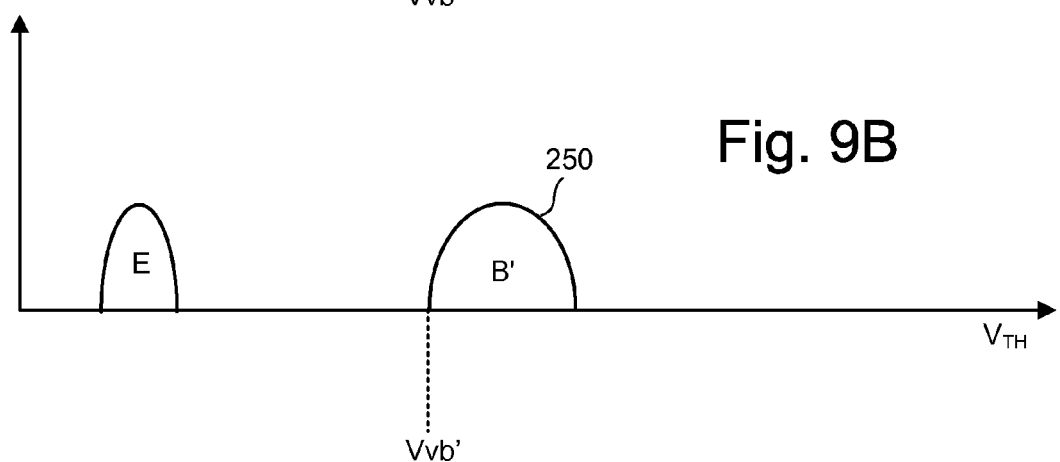
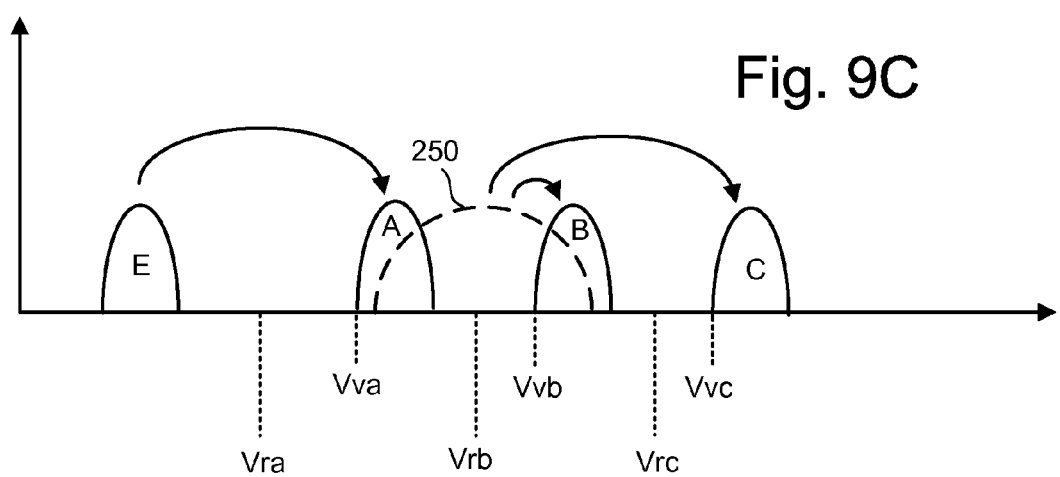

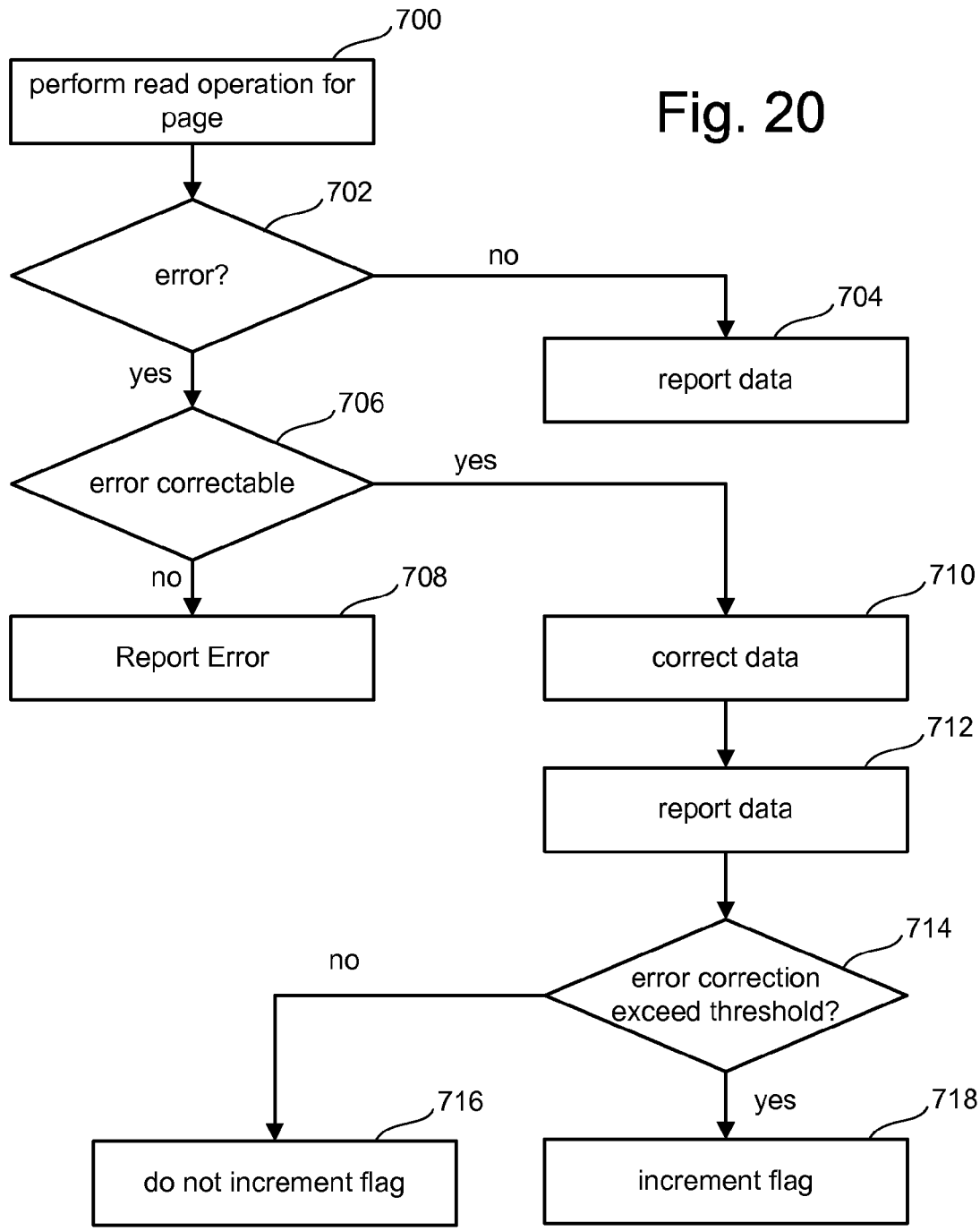

STARTING PROGRAM VOLTAGE SHIFT WITH CYCLING OF NON-VOLATILE MEMORY

CLAIM OF PRIORITY

This application is a continuation application of U.S. patent application Ser. No. 11/144,264, "Starting Program Voltage Shift with Cycling of Non-Volatile Memory," by Lutze, filed on Jun. 3, 2005, incorporated herein by reference.

BACKGROUND OF THE INVENTION

1. Field of the Invention

The present invention relates to programming non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," filed on Jul. 29, 2003; both applications are incorporated herein by reference in their entirety.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state (also called multi-level) flash memory device is implemented by identifying multiple distinct allowed/valid programmed threshold voltage ranges separated by forbidden ranges. Each distinct threshold voltage range corresponds to a predetermined value for the set of data bits encoded in the memory device.

Typically, the program voltage applied to the control gate during a program operation is applied as a series of pulses. In one embodiment, the magnitude of the pulses is increased with each successive pulse by a predetermined step size (e.g. 0.2v, 0.3v, 0.2v, or others). FIG. 1 shows a program voltage signal Vpgm that can be applied to the control gates (or, in some cases, steering gates) of flash memory cells. The program voltage signal Vpgm includes a series of pulses that increase in magnitude over time. In the periods between the program pulses, verify operations are carried out. That is, the programming level of each cell of a group of cells being programmed in parallel is read between successive programming pulses to determine whether it is equal to or greater than a verify level to which it is being programmed. For arrays of multi-state flash memory cells, the memory cells may perform a verification step of each state to allow a determination of whether the cell has reached its data associated verify level. For example, a multi-state memory cell capable of storing data in four states may need to perform verify operations for three compare points.

The choice of the magnitude of program voltage Vpgm is a compromise. Too high of a value will result in some memory cells being over-programmed, while too low of a value will result in longer programming times. Typically, users of non-volatile memory desire that the memory program quickly.

In the prior art devices, the same program signal is used for new devices that have not been significantly used (also called fresh devices) and heavily used devices. However, as a non-volatile memory device undergoes many programming cycles, charge becomes trapped in the insulation between the floating gate and the channel region. This trapping of charge shifts the threshold voltage to a higher level, which allows the memory cell to program quicker. If the magnitude of the program signal is set too high, even though it does not result in over programming of a fresh device, as that device becomes more heavily used then that device may experience over programming. Thus, new devices will have their program voltage set low enough to avoid over programming when the device is older. This lowering of the magnitude of the program voltage will reduce the speed at which the fresh device programs data.

SUMMARY OF THE INVENTION

The technology described herein provides a solution for programming data faster, without increasing the risk of over programming. To achieve this result, one set of programming characteristics are used to program a new device, while another set of programming characteristics are used to program the device after use of that device.

In one embodiment, the system programs a set of non-volatile storage elements during a first period using an increasing program signal with a first initial value and subsequently programs the set of non-volatile storage elements during a second period using an increasing program signal with a second initial value, where the second period is subsequent to the first period and the second initial value is different than the first initial value.

One implementation includes a set of non-volatile storage elements and one or more managing circuits in communication with said non-volatile storage elements. The one or more managing circuits receive a request to program data. In response to that request, the one or more managing circuits program the non-volatile storage elements using a programming signal having a first starting value if an indication of usage for the non-volatile storage elements indicates a first usage and program the non-volatile storage elements using a programming signal having a second starting value if the indication of usage indicates a second usage. One example of an indication of usage is a flag (one or more bits) that is stored in the non-volatile storage, a controller, a state machine or elsewhere. The flag stores data reflecting a measure of usage of the non-volatile storage elements.

BRIEF DESCRIPTION OF THE DRAWINGS

FIGS. 9A-C show various threshold voltage distributions and describe a process for programming non-volatile memory.

FIG. 20 is a flow chart describing one embodiment of a process for reading data.

DETAILED DESCRIPTION

Figure 2:
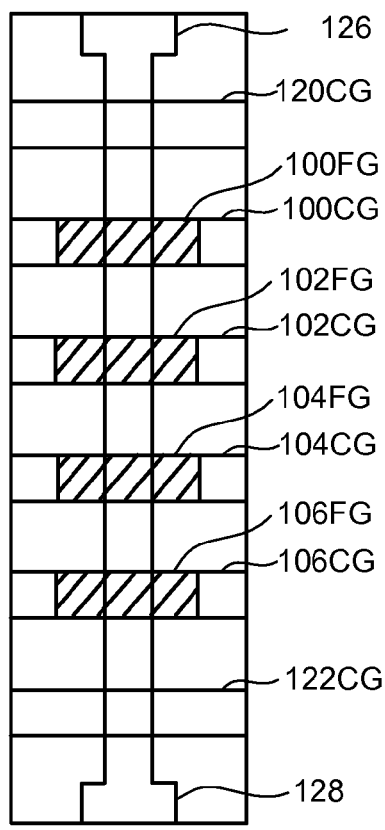
FIG. 2 is a top view of a NAND string.
Figure 3:
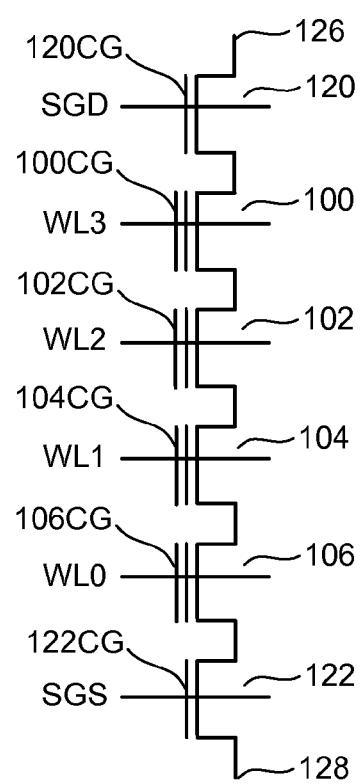
FIG. 3 is an equivalent circuit diagram of the NAND string.

One example of a non-volatile memory system suitable for implementing the present invention uses the NAND flash memory structure, which includes arranging multiple transistors in series between two select gates. The transistors in series and the select gates are referred to as a NAND string. FIG. 2 is a top view showing one NAND string. FIG. 3 is an equivalent circuit thereof. The NAND string depicted in FIGS. 2 and 3 includes four transistors, 100, 102, 104 and 106, in series and sandwiched between a first select gate 120 and a second select gate 122. Select gate 120 connects the NAND string to bit line contact 126. Select gate 122 connects the NAND string to source line contact 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 2 and 3. Select gate 120 is connected to select line SGD. Select gate 122 is connected to select line SGS.

Figure 4:
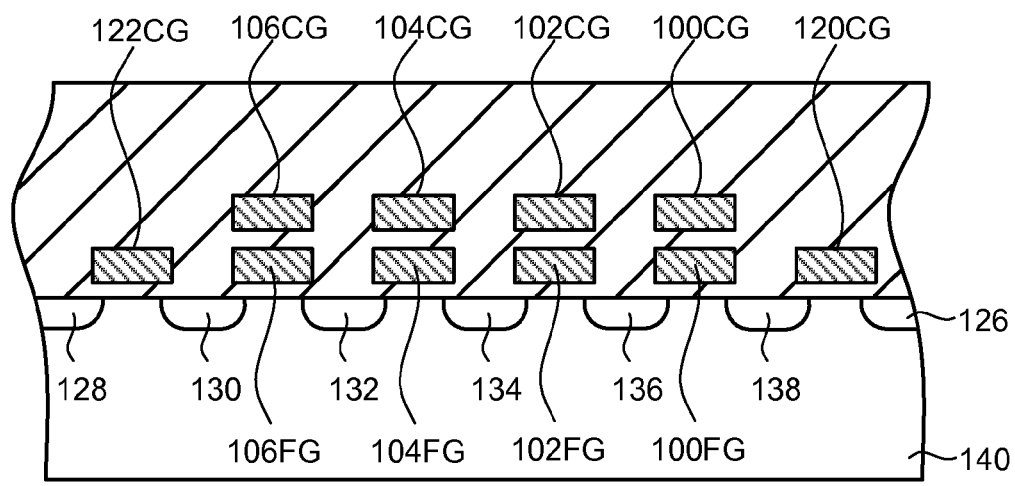
FIG. 4 is a cross-sectional view of the NAND string.

FIG. 4 provides a cross-sectional view of the NAND string described above. As depicted in FIG. 4, the transistors of the NAND string are formed in p-well region 140. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 2-4 show four memory cells in the NAND string, the use of four transistors is provided only as an example. A NAND string used with the technology described herein can have less than four memory cells or more than four memory cells. For example, some NAND strings will include 8 memory cells, 16 memory cells, 32 memory cells, 64 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected.

The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

Relevant examples of NAND-type flash memories and their operation are provided in the following U.S. patents/ patent applications, all of which are incorporated herein by reference in their entirety: U.S. Pat. No. 5,570,315; U.S. Pat. No. 5,774,397; U.S. Pat. No. 6,046,935; U.S. Pat. No. 5,386, 422; U.S. Pat. No. 6,456,528; and U.S. patent application Ser. No. 09/893,277 (Publication No. U.S. 2003/0002348). Other types of non-volatile memory in addition to NAND flash memory can also be used with the present invention.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory cells described in this paragraph can also be used with the present invention. Thus, the technology described herein also applies to coupling between dielectric regions of different memory cells.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory cells described in this paragraph can also be used with the present invention.

Figure 5:
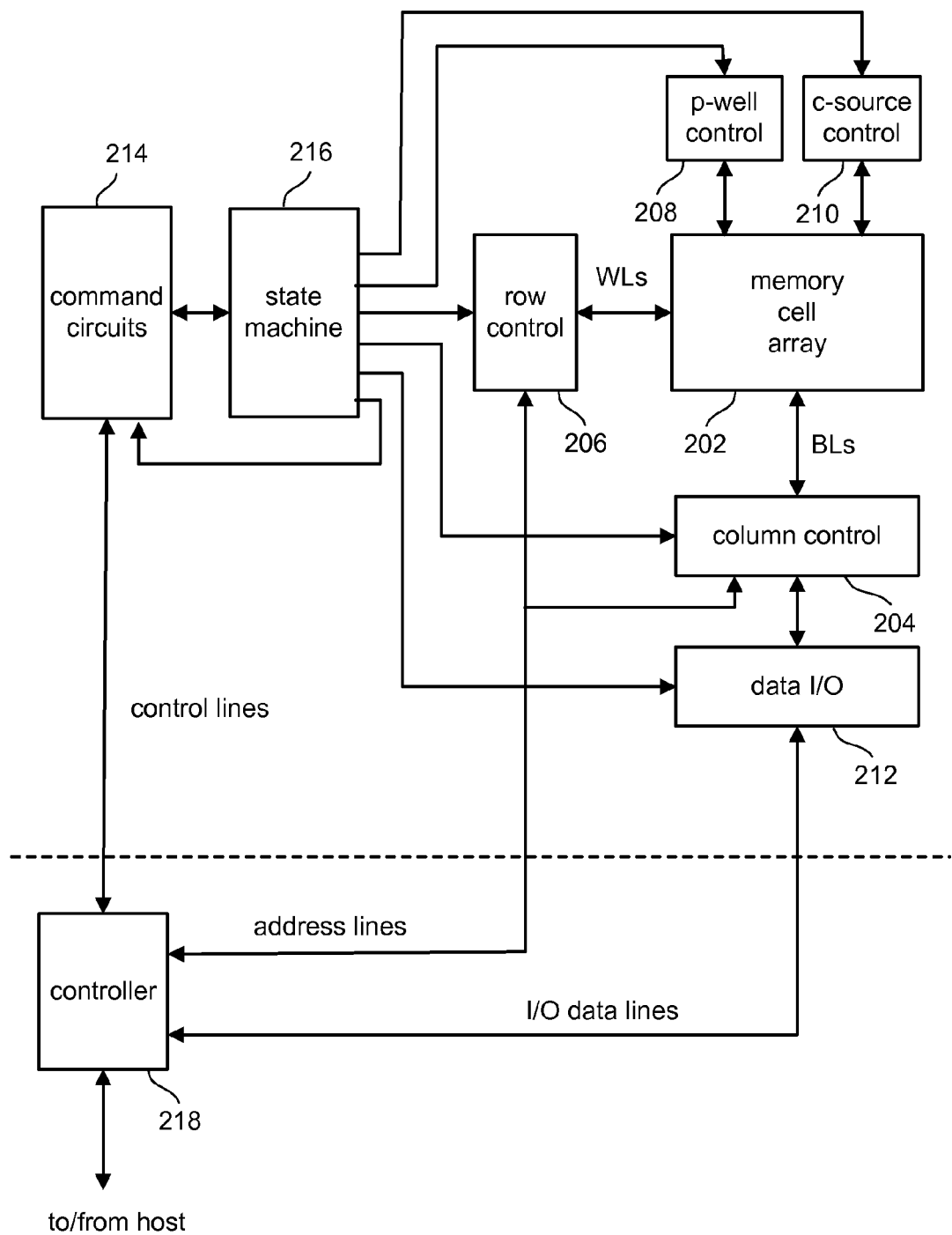
FIG. 5 is a block diagram of a non-volatile memory system.

FIG. 5 is a block diagram of one embodiment of a flash memory system that can be used to implement the present invention. Memory cell array 202 is controlled by column control circuit 204, row control circuit 206, c-source control circuit 210 and p-well control circuit 208. Column control circuit 204 is connected to the bit lines of memory cell array 202 for reading data stored in the memory cells, for determining a state of the memory cells during a program operation, and for controlling potential levels of the bit lines to promote the programming or to inhibit the programming. Row control circuit 206 is connected to the word lines to select one of the word lines, to apply read voltages, to apply program voltages and to apply an erase voltage. For example, program voltage levels used in EPROM and flash memory circuits are higher than the voltages normally used in memory circuits. They are often higher than the voltage supplied to the circuit. These higher voltages are preferably produced by a charge pump in row control circuit 206 (or elsewhere), which in one example essentially dumps charge into the capacitive wordline to charge it to a higher voltage. The charge pump receives an input at a voltage $V_{in}$ and provides an output at a higher voltage $V_{out}$ by boosting the input voltage progressively in a series of voltage multiplier stages. The voltage output is supplied to a load, for example the word line of an EPROM memory circuit. In some implementations, there is a feedback signal from the load to the charge pump. The conventional prior art pump turns off in response to a signal indicating that the load has reached a predetermined voltage. Alternatively, a shunt is used to prevent overcharging once the load reaches the predetermined voltage. However, this consumes more power and is undesirable in low power applications. More information about charge pumps can be found in U.S. Pat. No. 6,734,718, incorporated herein by reference in its entirety.

C-source control circuit 210 controls a common source line (labeled as "C-source" in FIG. 6) connected to the memory cells. P-well control circuit 208 controls the p-well voltage.

The data stored in the memory cells are read out by the column control circuit 204 and are output to external I/O lines via data input/output buffer 212. Program data to be stored in the memory cells are input to the data input/output buffer 212 via the external I/O lines, and transferred to the column control circuit 204. The external I/O lines are connected to controller 218.

Command data for controlling the flash memory device is input to controller 218. The command data informs the flash memory of what operation is requested. The input command is transferred to state machine 216, which controls column control circuit 204, row control circuit 206, c-source control 210, p-well control circuit 208 and data input/output buffer 212. State machine 216 can also output status data of the flash memory such as READY/BUSY or PASS/FAIL. In some embodiments, state machine 216 is responsible for managing the programming process, including the processes depicted in the flow charts described below.

Controller 218 is connected or connectable with a host system such as a personal computer, a digital camera, personal digital assistant, etc. Controller 218 communicates with the host in order to receive commands from the host, receive data from the host, provide data to the host and provide status information to the host. Controller 218 converts commands from the host into command signals that can be interpreted and executed by command circuits 214, which is in communication with state machine 216. Controller 218 typically contains buffer memory for the user data being written to or read from the memory array. In some embodiments, the programming process can be managed by the controller.

One exemplar memory system comprises one integrated circuit that includes controller 218, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the Controller being embedded in the host). Thus, the controller (or control capability) can be embedded in the host or included within a removable memory system.

In some implementations, some of the components of FIG. 5 can be combined. In various designs, one or more of the components of FIG. 5, other than memory cell array 202, can be thought of as a managing circuit. For example, one or more managing circuits may include any one of or a combination of a command circuit, a state machine, a row control circuit, a column control circuit, a well control circuit, a source control circuit or a data I/O circuit.

Figure 6:
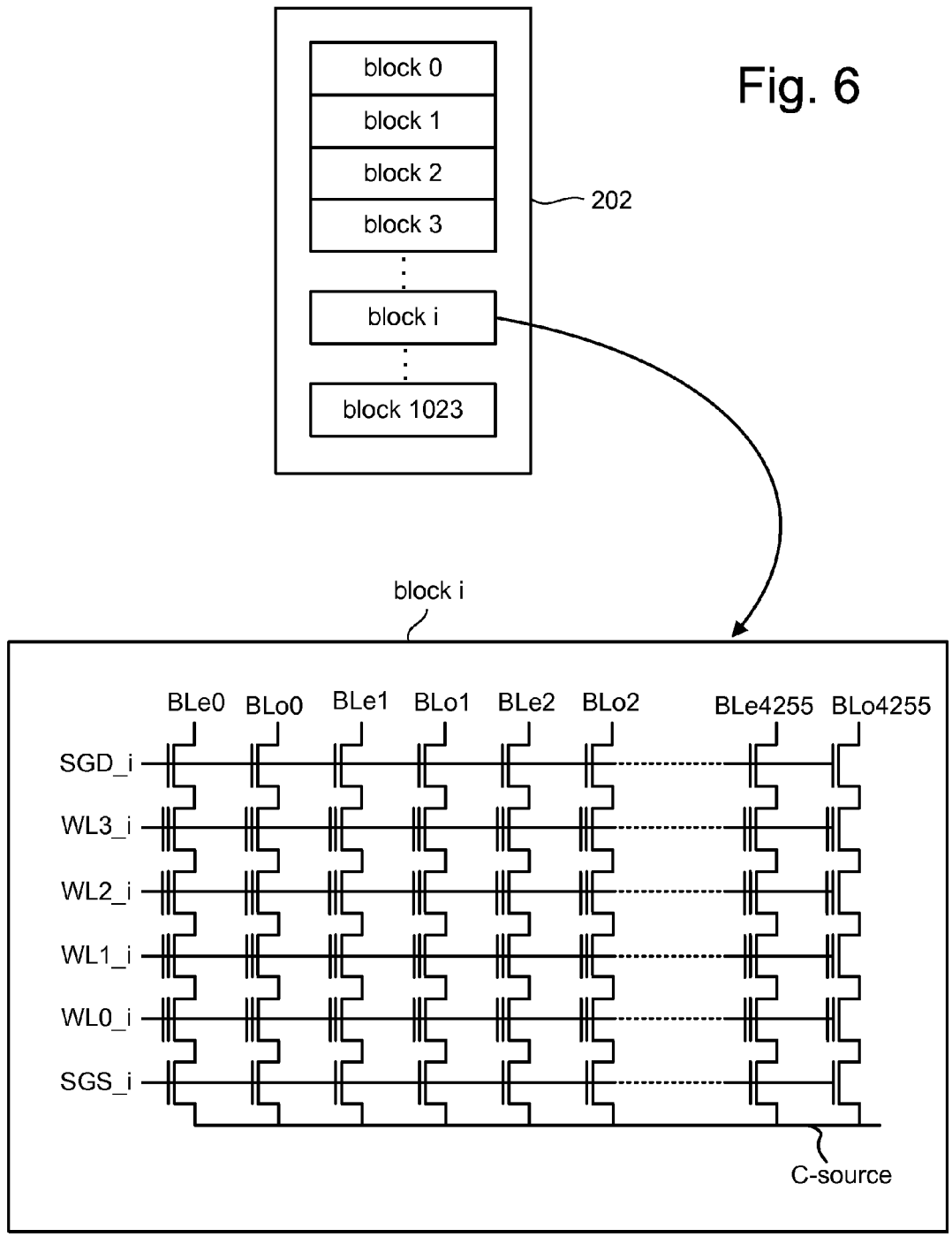
FIG. 6 is a block diagram of a non-volatile memory array.

With reference to FIG. 6, an example structure of memory cell array 202 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 6 shows four memory cells connected in series to form a NAND string. Although four cells are shown to be included in each NAND string, more or less than four memory cells can be used. One terminal of the NAND string is connected to corresponding bit line via a select transistor SGD, and another terminal is connected to c-source via a second select transistor SGS.

During one embodiment of read and programming operations, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g., multi-state memory cells), wherein each of these two bits are stored in a different page, one block stores 16 logical pages. Other sized blocks and pages can also be used with the present invention. Additionally, architectures other than that of FIGS. 5 and 6 can also be used to implement the present invention. For example, in one embodiment the bit lines are not divided into odd and even bit lines so that all bit lines are programmed and read concurrently (or not concurrently).

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative (in one embodiment).

In the read and verify operations, the select gates (SGD and SGS) and the unselected word lines (e.g., WL0, WL2 and WL3) are raised to a read pass voltage (e.g. 4.5 volts) to make the transistors operate as pass gates. The selected word line (e.g. WL1) is connected to a voltage, a level of which is specified for each read and verify operation in order to determine whether a threshold voltage of the concerned memory cell is above or below such level. For example, in a read operation for a two level memory cell, the selected word line WL1 may be grounded, so that it is detected whether the threshold voltage is higher than 0V. In a verify operation for a two level memory cell, the selected word line WL1 is connected to 0.8V, for example, so that it is verified whether or not the threshold voltage has reached at least 0.8V. The source and p-well are at zero volts. The selected bit lines (BLe) are pre-charged to a level of, for example, 0.7V. If the threshold voltage is higher than the read or verify level on the word line, the potential level of the bit line (BLe) associated with the cell of interest maintains the high level because of the non-conductive memory cell. On the other hand, if the threshold voltage is lower than the read or verify level, the potential level of the concerned bit line (BLe) decreases to a low level, for example less than 0.5V, because of the conductive memory cell discharging the bitline. The state of the memory cell is thereby detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

As described above, each block can be divided into a number of pages. In one embodiment, a page is a unit of programming. In some implementations, the individual pages may be divided into segments and the segments may contain the fewest number of cells that are written at one time as a basic programming operation. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller calculates the ECC when data is being programmed into the array, and also checks it when data is being read from the array. Alternatively, the ECCs and/or other overhead data are stored in different pages, or even different blocks, than the user data to which they pertain. In other embodiments, other parts of the memory device (e.g., state machine) can calculate the ECC.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages.

Figure 7:
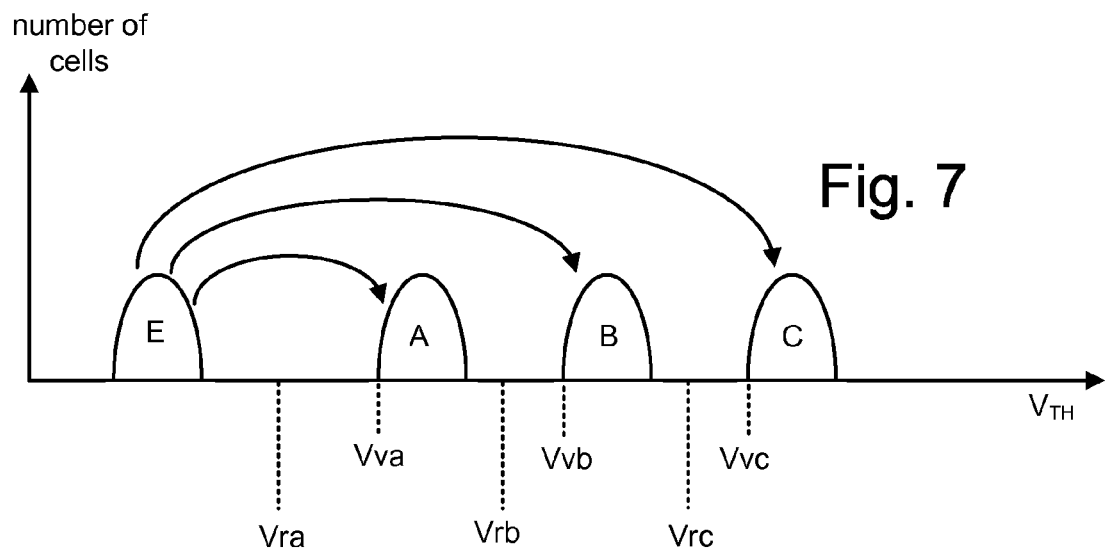
FIG. 7 depicts an example set of threshold voltage distributions.

FIG. 7 illustrates threshold voltage distributions for the memory cell array when each memory cell stores two bits of data. FIG. 7 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 7 corresponds to predetermined values for the set of data bits. The specific relationship between the data programmed into the memory cell and the threshold voltage levels of the cell depends upon the data encoding scheme adopted for the cells. One example assigns "11" to threshold voltage range E (state E), "10" to threshold voltage range A (state A), "00" to threshold voltage range B (state B) and "01" to threshold voltage range C (state C). However, in other embodiments, other schemes are used.

FIG. 7 also shows three read reference voltages, Vra, Vrb and Vrc, for reading data from memory cells. By testing whether the threshold voltage of a given memory cell is above or below Vra, Vrb and Vrc, the system can determine what state the memory cell is in. FIG. 7 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C (as depicted by the curved arrows). For example, a population of memory cells to be programmed may first be erased so that all memory cells in the population are in erased state E. While some memory cells are being programmed from state E to state A, other memory cells are being programmed from state E to state B and/or from state E to state C.

Figure 8:
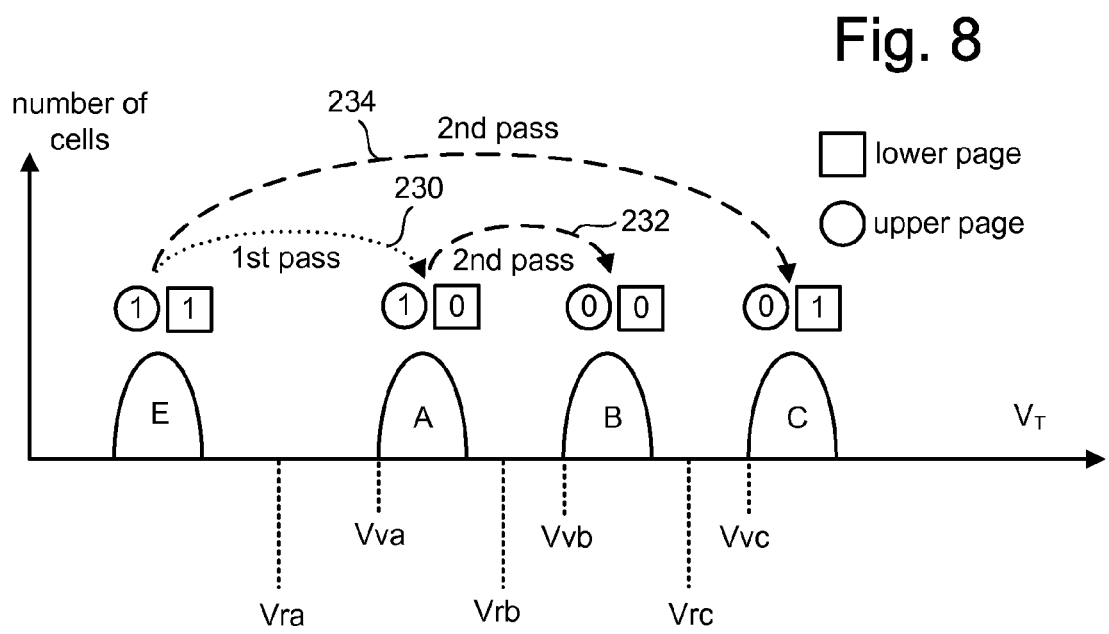
FIG. 8 depicts an example set of threshold voltage distributions.

FIG. 8 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 230. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 234. If the cell had been programmed into state A as a result of the first programming pass, then the memory cell is further programmed in the second pass so that the threshold voltage is increased to be within state B, as depicted by arrow 232. The result of the second pass is to program the cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. patent application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

FIGS. 9A-C disclose another process for programming non-volatile memory that reduces floating gate to floating gate coupling by, for any particular memory cell, writing to that particular memory cell with respect to a particular page subsequent to writing to adjacent memory cells for previous pages. In one example of an implementation of the process taught by FIGS. 9A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes these pages of data will be called upper page and lower page; however, they can be given other labels. With reference to state A for the process of FIG. 9, the upper page stores bit 0 and the lower page stores bit 1. With reference to state B, the upper page stores bit 1 and the lower page stores bit 0. With reference to state C, both pages store bit data 0. The programming process of FIG. 9 is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 9A therefore shows the programming of memory cells from state E to state B'. State B' depicted in FIG. 9A is an interim state B; therefore, the verify point is depicted as Vvb', which is lower than Vvb.

In one embodiment, after a memory cell is programmed from state E to state B', its neighbor memory cell on an adjacent word line will then be programmed with respect to its lower page. After programming the neighbor memory cell, the floating gate to floating gate coupling effect will raise the apparent threshold voltage of memory cell under consideration, which is in state B'. This will have the effect of widening the threshold voltage distribution for state B' to that depicted as threshold voltage distribution 250 of FIG. 9B. This apparent widening of the threshold voltage distribution will be remedied when programming the upper page.

FIG. 9C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 250 and the upper page data is to remain at 1, then the memory cell will be programmed to final state B. If the memory cell is in intermediate threshold voltage distribution 250 and the upper page data is to become data 0, then the threshold voltage of the memory cell will be raised so that the memory cell is in state C. The process depicted by FIGS. 9A-C reduces the effect of floating gate to floating gate coupling because only the upper page programming of neighbor memory cells will have an effect on the apparent threshold voltage of a given memory cell. An example of an alternate state coding is to move from distribution 250 to state C when the upper page data is a 1, and to move to state B when the upper page data is a 0. Although FIGS. 9A-C provide an example with respect to four data states and two pages of data, the concepts taught by FIGS. 19A-C can be applied to other implementations with more or less than four states and different than two pages. More detail about various programming schemes and floating gate to floating gate coupling can be found in U.S. patent application Ser. No. 11/099,133, titled "Compensating For Coupling During Read Operations Of Non-Volatile Memory," filed on Apr. 5, 2005.

Figures 1, 10, 12:
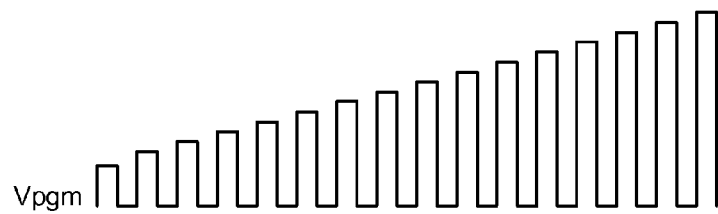
FIG. 1 depicts one example of a program voltage that can be applied to one or more control gates of flash memory devices.
FIG. 10 is a chart describing programming performance.
FIG. 12 is a chart describing programming performance.

FIG. 10 provides a table that describes examples of performance during programming of non-volatile memory. Data is provided for fresh devices (unused) and devices that have already performed 10,000 programming cycles. In one embodiment, a programming cycle includes the actions of programming and erasing (or erasing and then programming). In other embodiments, the programming cycle can include programming without erasing. The table of FIG. 10 shows how many programming pulses (Vpgm) are used to program data into the lower pages and upper pages according to the method described above with respect to FIG. 8. There's also data for performing full sequence programming according to the method described with respect to FIG. 7. In both cases, the magnitude of the initial pulse is 16.0 volts and the step size is 0.3 volts. As depicted in FIG. 10, the average programming time for a fresh device was 800 μsec and the average programming time for the used device is 650 μsec. Fresh devices required approximately 3 more programming pulses than cycled devices. In addition, fresh devices required more program pulses during the soft programming process (described below).

To increase the speed of the programming process, without unreasonably increasing the risk of over-programming, it is proposed to use one set of programming parameters when programming a fresh device and another set of programming parameters when programming a device that has been subject to a certain amount of use.

Figure 11:
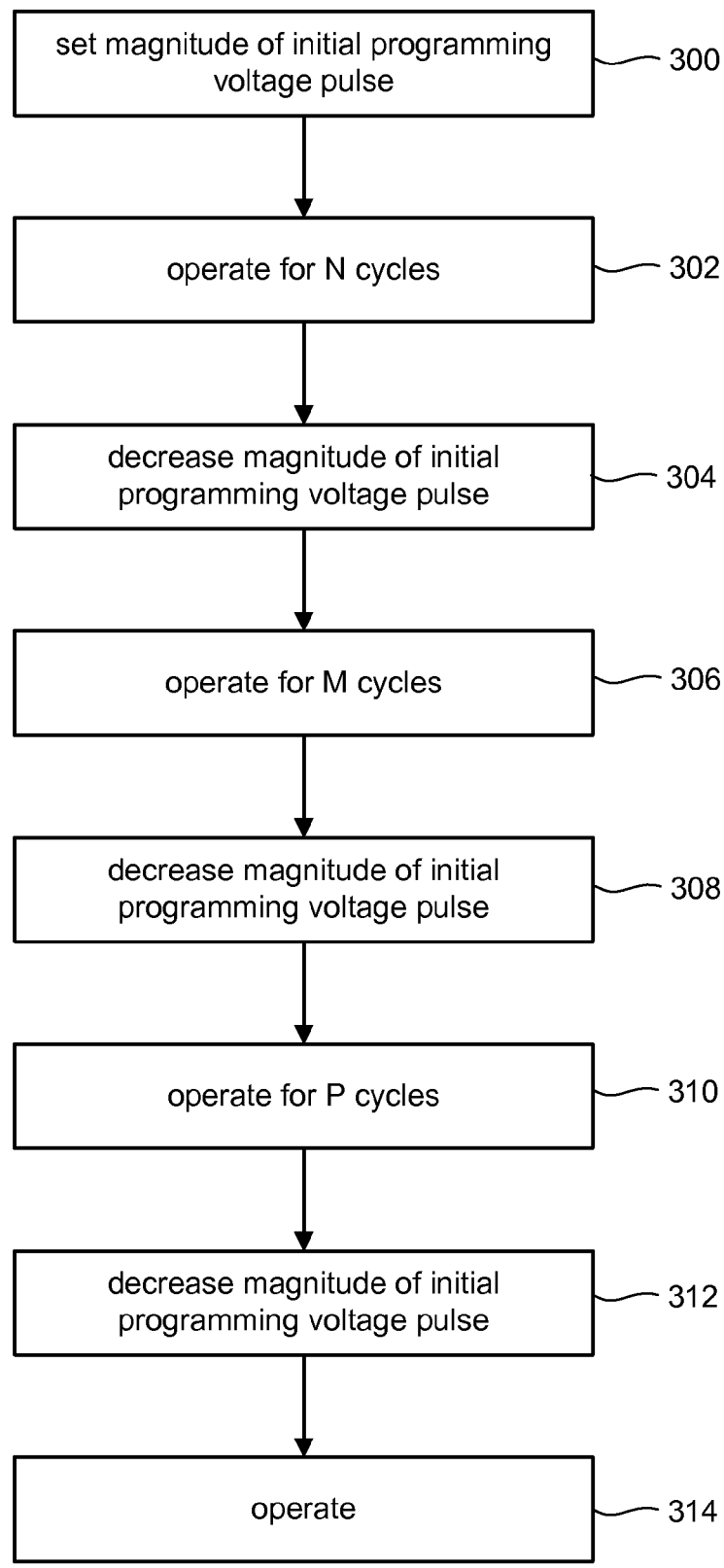
FIG. 11 is a flow chart describing one embodiment of a process for programming non-volatile storage.
Figure 11A:
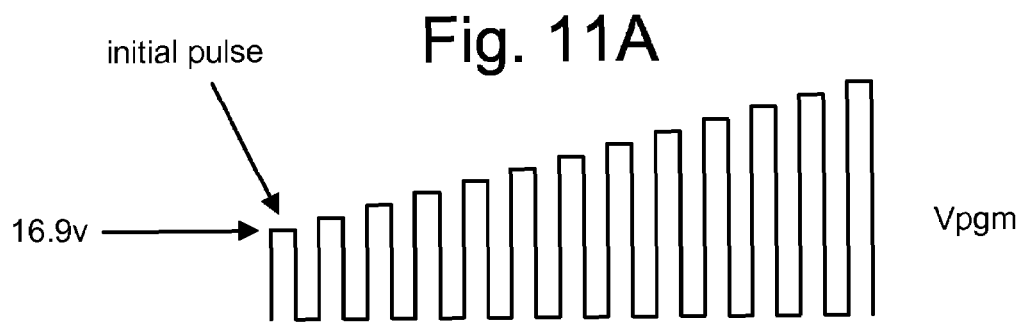
FIGS. 11A-D depicts program signals with initial pulses having different magnitudes.
Figure 11B:
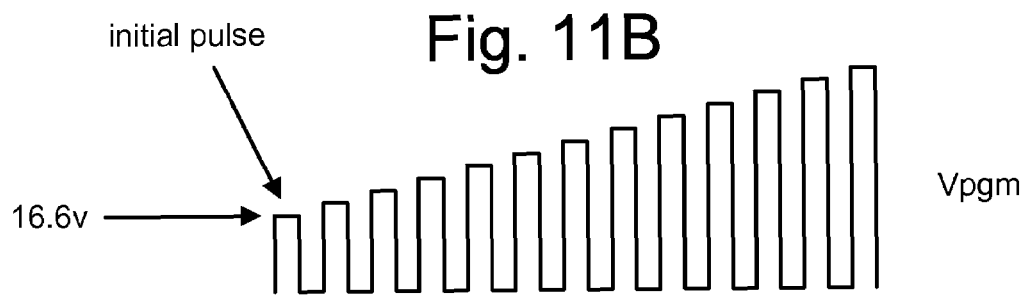
Figure 11C:
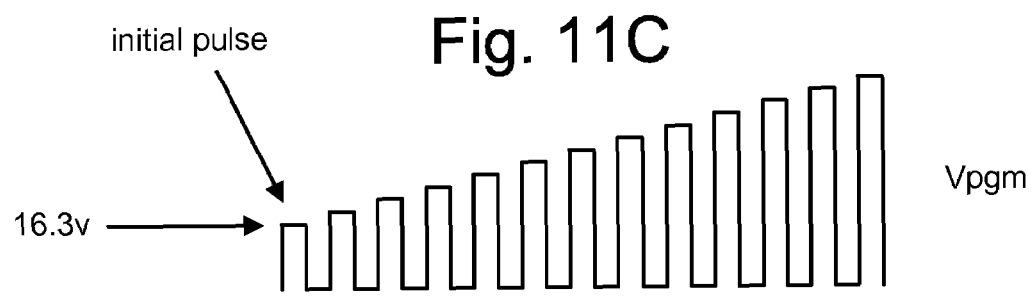
Figure 11D:
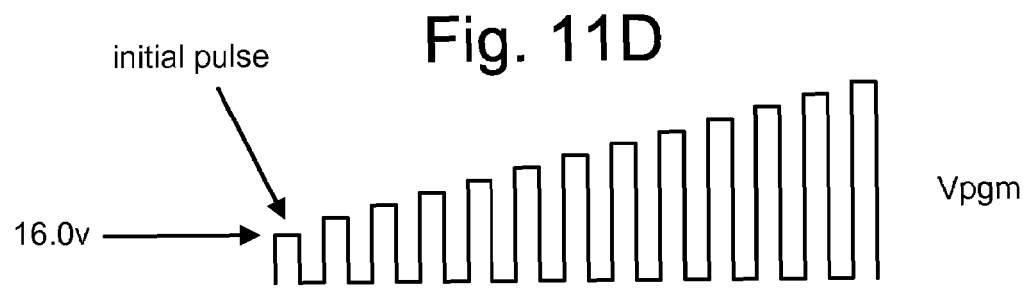

In one embodiment, fresh devices and used devices can be programmed with different programming parameters by varying the magnitude of the initial programming pulse of the programming signal Vpgm (see e.g. FIG. 1). FIG. 11 is a flow chart describing one embodiment of a process for programming non-volatile memory by varying the magnitude of the initial programming pulse over time. In step 300, the initial programming voltage is set. That is, the device determines the magnitude of the first pulse for the program signal Vpgm. In one example depicted in FIG. 11A, the magnitude of the first pulse of the program voltage applied to the controls gate is 16.9v. Each successive pulse has a magnitude increased by 0.3v in comparison to the previous pulse. In step 302, the device is operated for N cycles, where the number N is predetermined in advance or determined on the fly. In step 304, after N cycles, the magnitude of the initial programming pulse for Vpgm is decreased. In one example depicted in FIG. 11B, the magnitude of the first pulse of the program voltage Vpgm applied to the controls gates is decreased to 16.6v. Each successive pulse has a magnitude increased by 0.3v in comparison to the previous pulse. In step 306, the device is operated for M cycles (M can be the same or different than N), where the magnitude of the number M is determined in advance or on the fly. In step 308, after operating for N+M cycles, the initial programming voltage is decreased to a new value. In one example depicted in FIG. 11C, the magnitude of the first pulse of the program voltage Vpgm applied to the controls gates is decreased to 16.3v. Each successive pulse has a magnitude increased by 0.3v in comparison to the previous pulse. In step 310, the device is operated for an additional P cycles, where the magnitude of P is known in advance or determined on the fly. In step 312, the magnitude of the initial pulse for the program voltage Vpgm is decreased. In one example depicted in FIG. 11D, the magnitude of the first pulse of the program voltage Vpgm applied to the controls gates is decreased to 16.0v. Each successive pulse has a magnitude increased by 0.3v in comparison to the previous pulse. In step 314, the device is operated with the new initial pulse. The process of decreasing the magnitude of the initial programming pulse can continue for as many steps as desired.

FIG. 12 provides a table with example performance metrics corresponding to the process of FIG. 11. In one embodiment, the initial programming pulse will have a magnitude set at 16.9 volts in step 300. After 1K programming cycles (step 302), the magnitude of the initial pulse will be decreased to 16.6 volts (step 304). After operating for approximately 3,000 cycles the magnitude of the initial pulse will be lowered to 16.3 volts and the programming voltage will then increase at 0.3 volts per pulse. After operating for 10,000 cycles, the initial program pulse will have its magnitude set to 16.0 volts. With this scheme, the number of pulses for programming the lower page will be 10; for programming the upper page will be 15; and for programming full sequence will be 19. The performance during the programming process is constant throughout the life of the device. The programming performance of a fresh part has increased without an increase in over-programming.

FIG. 13-20 provide additional details of various embodiments for implementing the concepts associated with FIG. 11. In addition to counting the programming cycles, as explained above with respect to FIG. 12, other embodiments include counting the number of soft program pulses needed to perform soft programming. When the number of soft programming pulses reaches a threshold, the magnitude of the initial programming pulse will be changed. In another embodiment, the system will count the number of programming iterations (or pulses) during a programming particular cycle. When the number of iterations (or pulses) exceeds the threshold, then the magnitude of the initial programming pulse will change. In yet another embodiment, the system may decide to change the initial magnitude based on the amount of error correction used during a read process. Any of these schemes for adjusting the programming characteristics can be applied on the entire device as a whole (e.g., the entire memory array), on a block by block basis, or on another subset of the memory. The process can be performed by the controller, the state machine, a combination of both, or another structure.

Figure 13:
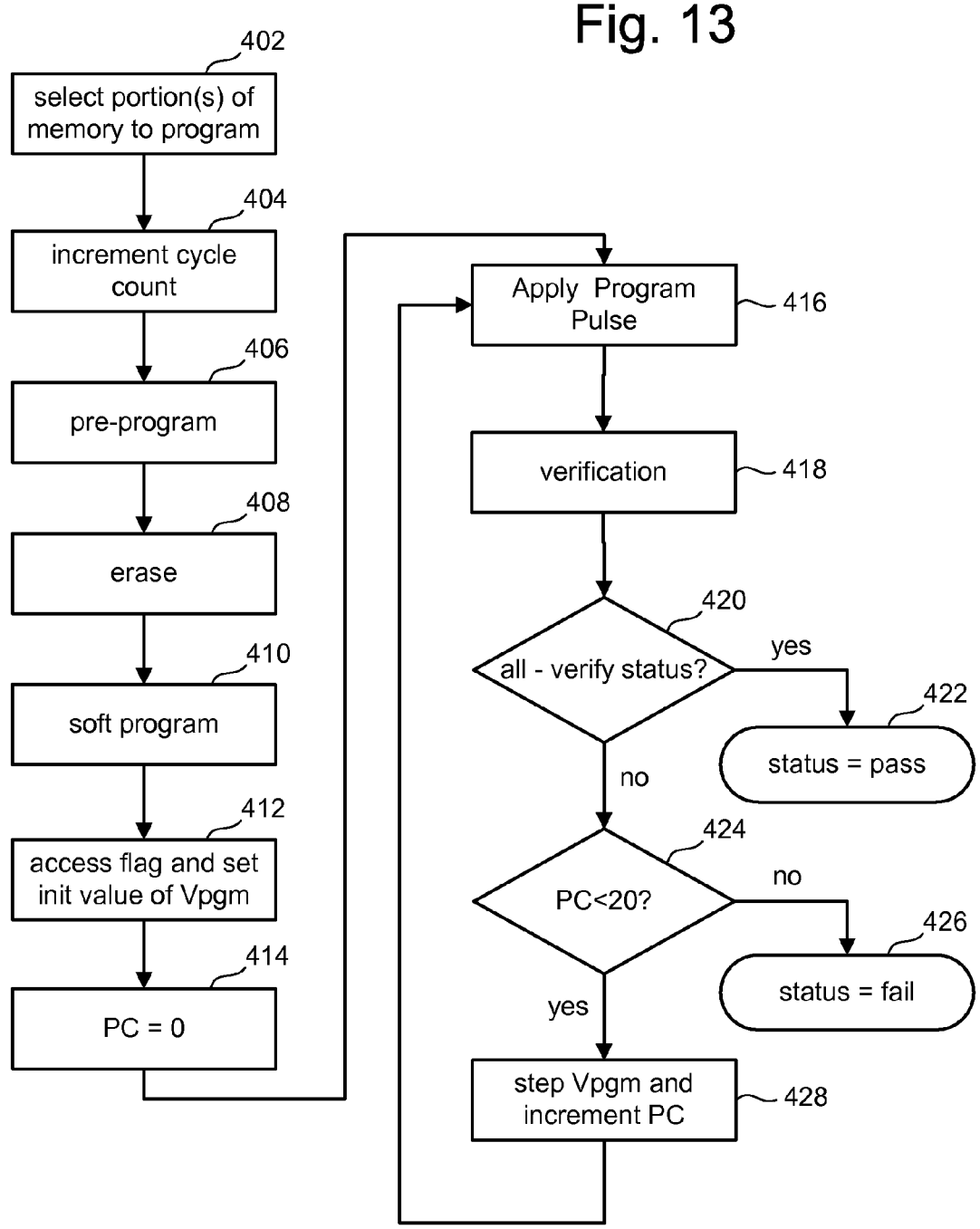
FIG. 13 is a flow chart describing one embodiment of a process for programming non-volatile storage.

FIG. 13 is a flow chart describing more details of programming memory cells, where the system counts the number of program cycles and adjusts the magnitude of the initial programming pulse accordingly. The process of FIG. 13 can be performed in response to receiving a request to program data. In step 402, the system will select the appropriate portions of memory to program. This may include selecting a block and/or page and/or sector to write to. At step 404, the cycle count is incremented. The cycle count is a count of the number of programming cycles. The cycle count can be stored in the flash memory array, the state machine, the controller, or another location. In one embodiment, the cycle count is stored in a register associated with the state machine. At step 406, the selected portion of memory is pre-programmed, which provides for even wearing of the flash memory. All memory cells in the chosen sector or page are programmed to the same threshold voltage range. Step 406 is an optional step. At step 408, all the memory cells to be programmed are then erased. For example, step 408 can include moving old memory cells to state E (see FIGS. 7-9). At step 410, the system performs a soft programming process. During the erase process, it is possible that some of the memory cells have their threshold voltages lowered to a value that is below the distribution E (see FIGS. 7-9). The soft programming process will apply program voltage pulses similar to FIG. 1 to memory cells so that their threshold voltages will increase to be within threshold voltage distribution E. In step 412, the system will access a flag that indicates the magnitude of the initial program pulse. For example, using the table of FIG. 12, if the part had performed 1,000 cycles, the magnitude of the program pulse for the initial pulse will be 16.6 volts. That initial value is set at step 412 by properly programming the charge pump. At step 414, the program count PC will be set to initially be zero. In step 416, a program pulse is applied to the appropriate word line(s). In step 418, the memory cells on that word line(s) are verified to see if they have reached the target threshold voltage level. If all the memory cells have reached the target threshold voltage level (step 420), then the programming process has completed successfully (status=pass) in step 422. If not all the memory cells have been verified, then it is determined in step 424 whether the program count PC is less than 20. If the program count is not less than 20, then the programming process has failed (step 426). If the program count is less than 20, than in step 428, the magnitude of program voltage signal Vpgm is incremented by the step size (e.g. 0.3v) for the next pulse and the program count PC is incremented. Note that those memory cells that have reached their target threshold voltage are locked out of programming for the remainder of the current programming cycle. After step 428, the process of FIG. 13 continues at step 416 and the next program pulse is applied.

Figure 14:
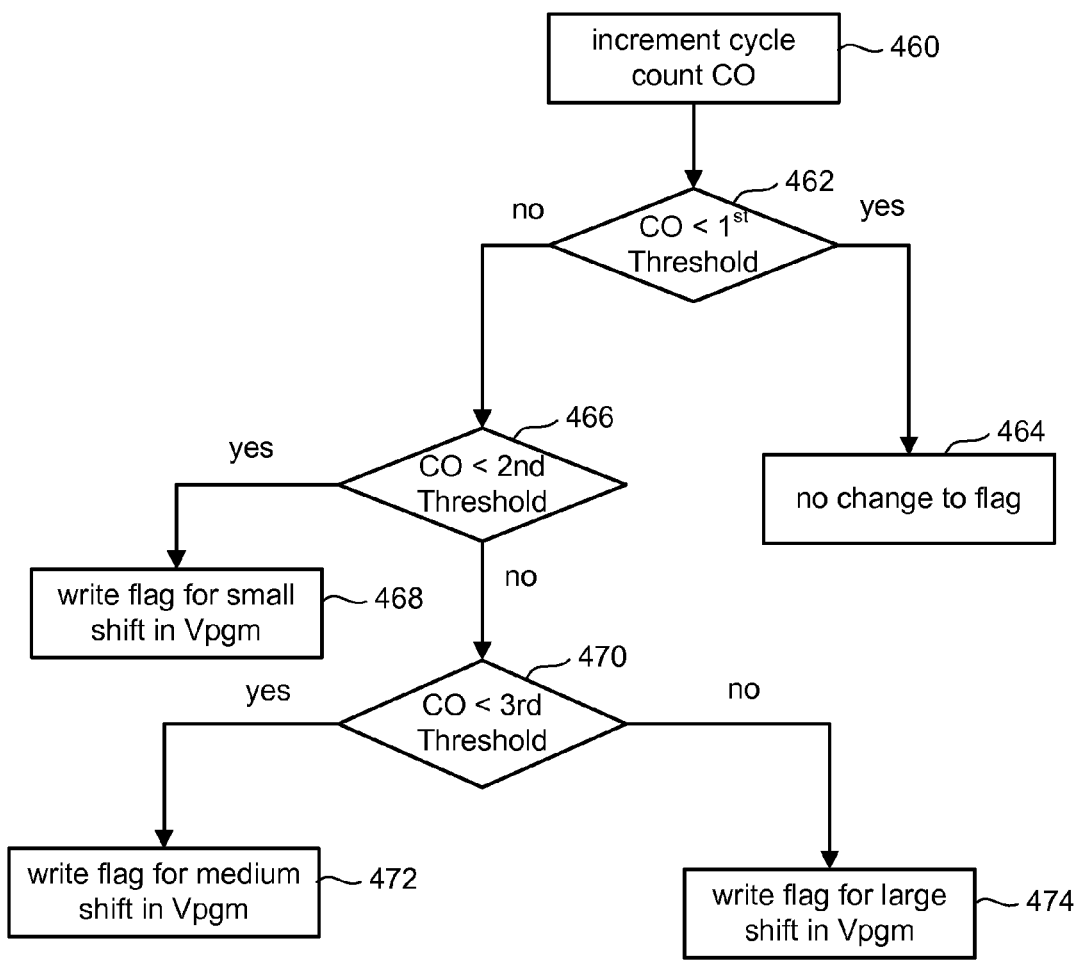
FIG. 14 is a flow chart describing one embodiment of a process for incrementing the cycle count.

FIG. 14 is a flowchart describing the process of incrementing the cycle count and adjusting the flag, which is performed as part of step 404 of FIG. 13. In step 460, the cycle count (labeled CO) is incremented. The cycle count represents the number of program cycles that have been performed on this particular device, block, etc. In step 462, it is determined whether the cycle count is less than a first threshold. One example of a first threshold is 1,000. If the cycle count is less than the first threshold, then there's no change to the flag in step 464. The flag can be a set of one or more bits that store an indication of which magnitude to use for the initial program pulse. In one embodiment, the flag can be stored in the flash memory array. In another embodiment, the flag can be stored in a register associated with the state machine or with the controller. In an embodiment that includes four potential magnitudes for the starting pulse, the flag would need to be able to store four values; therefore, the flag would need to be 2 bits. For ease of design, it may be desirable to have the flag include one byte. If it is determined at step 462 that the cycle count is not less than the first threshold, then it is determined in step 466 where the cycle count is less than a second threshold. An example of the second threshold is 3,000 cycles. If the cycle count is less than the second threshold, then the flag is overwritten with an indication that identifies the magnitude of the initial program pulse to be the magnitude associated with a fresh device shift by a small amount. For example, when the device passes the first threshold, the initial Vpgm (e.g. 16.9 volts) is decreased by the small shift (0.3 volts) to 16.6 volts at step 468. If in step 466 it is determined that the cycle count CO is not less than the second threshold, then at step 470 it is determined whether the cycle count is less than the third threshold. If the cycle count is less than the third threshold, then the cycle count is between the second and third threshold and the system will overwrite the flag with an indication that identifies a medium shift from the initial program pulse magnitude associated with a fresh device. For example, the initial program voltage will be downshifted by two steps (e.g., 0.6 volts). If the cycle count is not less than the third threshold, then the initial program voltage of a fresh device will be shifted down by the large shift, which can include three steps (e.g., 0.9 volts). Thus, in step 474, the flag indicates that the magnitude for the initial program pulse should be 16.0 volts in the example of FIG. 12. In some embodiments, the flag need not be overwritten if its value does not change. The flag written in FIG. 14 is the flag that is checked in step 412 of FIG. 13.

Figure 15:
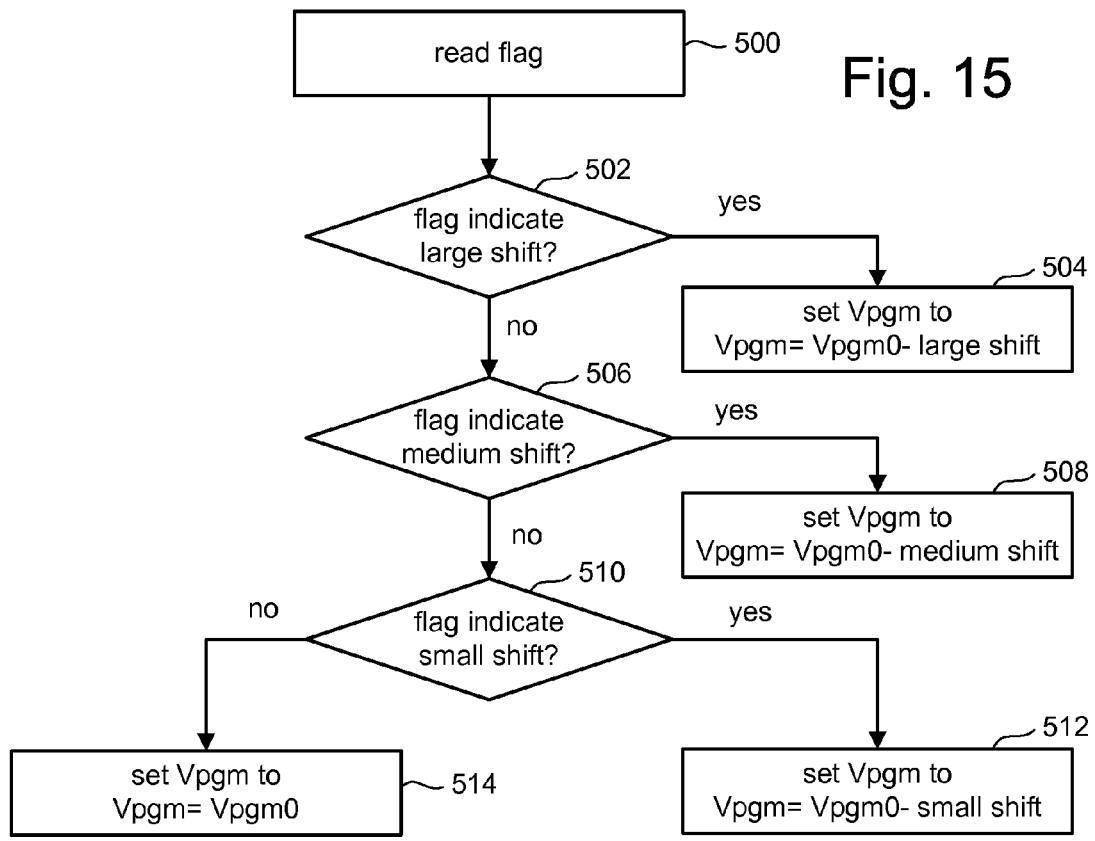
FIG. 15 is a flow chart describing one embodiment of a process for setting the initial value for the program signal Vpgm.

FIG. 15 is a flow chart describing the process for setting the magnitude of the initial pulse for the programming signal Vpgm, which is performed as part of step 412 of FIG. 13. In step 500, the flag written to by the process of FIG. 14 is read. If the flag indicates a large shift (step 502) then the magnitude of the initial pulse for the programming signal Vpgm is set to the initial magnitude less a large shift. Using the example of FIG. 12, the initial programming voltage Vpgm0 associated with a fresh device is 16.9 volts and the large shift is 0.9 volts; therefore, step 504 shifts the magnitude of the initial pulse to 16.0 volts. If the flag does not indicate a large shift (step 502), then the system determines whether the flag indicates a medium shift (step 506). If so, then the magnitude of the first pulse is set to Vpgm0 (e.g., 16.9v) less a medium shift (e.g., 0.6v). In the example of FIG. 12, step 508 would set the magnitude of the initial pulse to 16.3 volts. If the flag does not indicate a medium shift, then it is determined whether the flag indicates a small shift (step 510). If the flag indicates a small shift, then the magnitude of the first pulse is set to Vpgm0 less a small shift (e.g., 0.3v) in step 512. If the flag does not indicate a small shift, then the magnitude of the first pulse remains at Vpgm0 (e.g., 16.9v).

Figure 16:
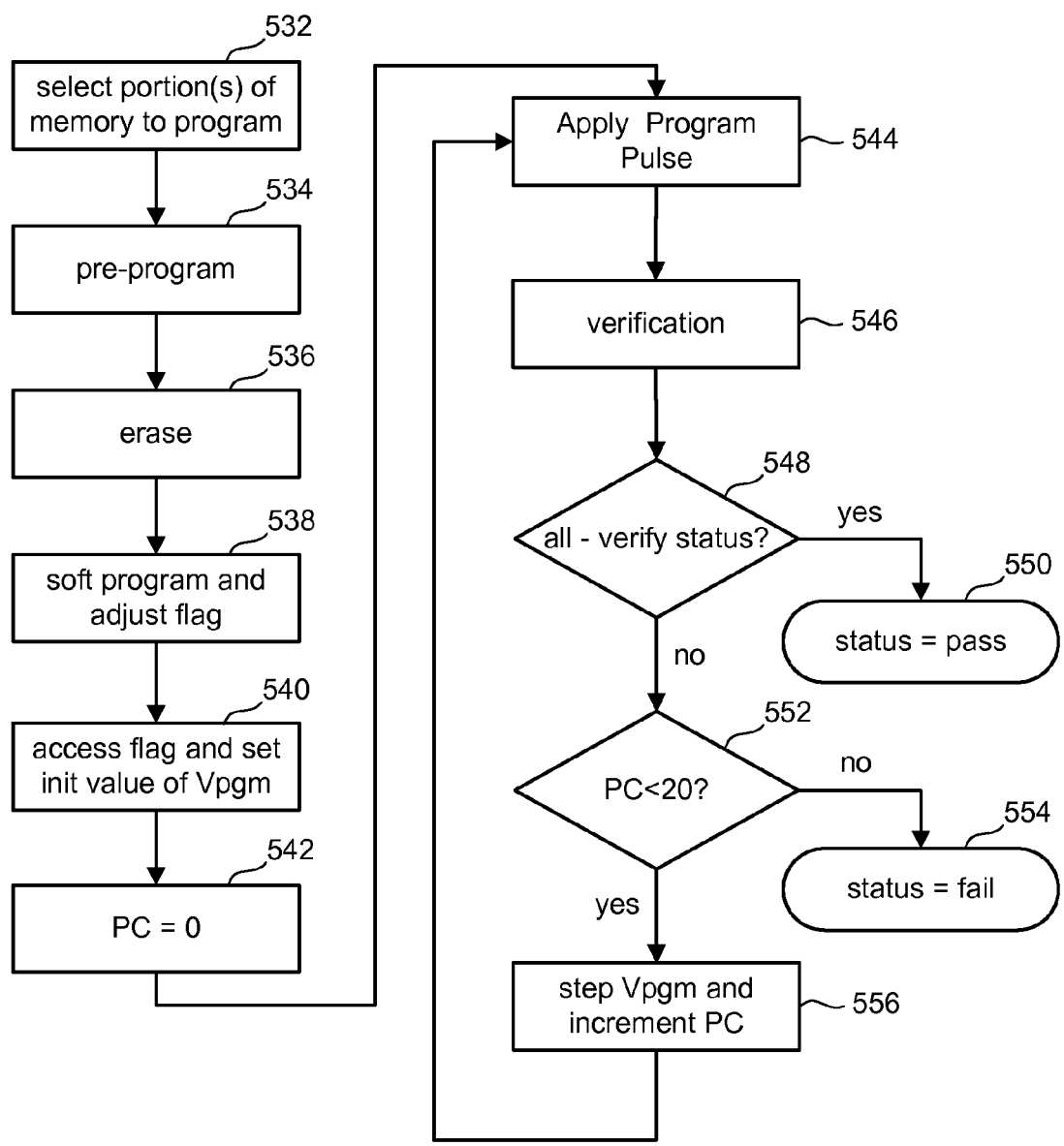
FIG. 16 is a flow chart describing one embodiment of a process for programming non-volatile storage.

FIG. 16 is a flow chart describing a programming process for an embodiment which determines the magnitude for the initial programming pulse based on performance during the soft programming process. Steps 532, 534 and 536 of FIG. 16 are similar to steps 402, 406 and 408, respectively of FIG. 13. Step 540 of FIG. 16 is similar to step 412 of FIG. 13. Steps 542, 544, 546, 548, 550, 552, 554, and 556 of FIG. 16 are similar to steps 414, 416, 418, 420, 422, 424, 426, and 428 of FIG. 13.

Figure 17:
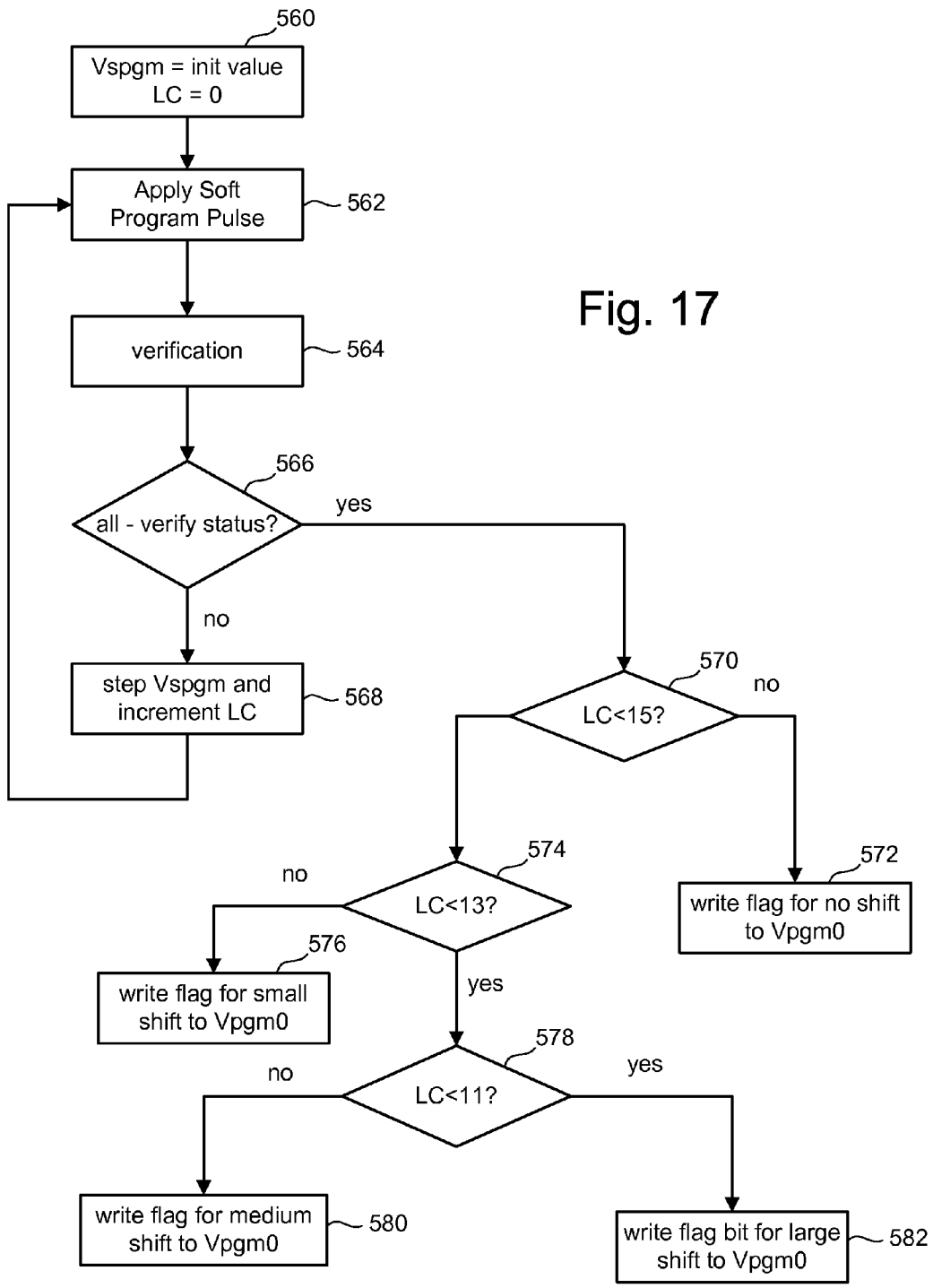
FIG. 17 is a flow chart describing one embodiment of a process for performing a soft programming process.

FIG. 17 is a flow chart describing the process of soft programming and appropriately adjusting the flag, as performed in step 538 of FIG. 16. The process of FIG. 17 uses a set of pulses with increasing magnitude similar to the signal of FIG. 1. Because this is used during a soft programming process, the signal is referred to as Vspgm and the pulses are referred to as soft programming pulses. In step 560 of FIG. 17, the initial pulse has its magnitude set. In one embodiment, the magnitude of the initial pulse during soft programming is approximately 14 volts. Other values can also be used. Additionally, the loop count LC is set at zero. In step 562, a soft program pulse is applied to the word line(s) of the selected memory cells. In step 564, a verification process is performed to see whether the memory cells have their threshold voltage within distribution E (see FIG. 7-9). If not all the memory cells verified having their threshold voltage in distribution E, then the soft program voltage signal Vspgm is incremented to the next pulse and the loop count LC is increased by 1. After step 568, the process loops back to 562. The loop of steps 562, 564, 566, and 568 will continue until all the memory cells have verified or the process stops because the system concluded that an error has occurred. For example, the system may limit the number of iterations to no more than 20. After 20, iterations the system will conclude that the memory cells whose threshold voltage are still below threshold distribution E are damaged and will remove those from normal operational use.

Once all the memory cells verify (step 566), the process will continue at step 570 and the system will determine whether the loop count LC is less than 15. If not, then the flag will be written with an indication that no shifts should be done from Vpgm0. This corresponds to a fresh device. If the loop count is less than 15, then at step 574 it is determined whether the loop count is less than 13. If the loop count is not less than 13 (e.g., LC=13 or 14) then the flag will be written to indicate a small shift from Vpgm0. If the loop count LC is less then 13, then it is tested whether the loop count is less than 11 at step 578. If the loop count is not less than 11, then the system will write to the flag to indicate that a medium shift from Vpgm0 should be used at step 580. If the loop count is less than 11, an indication is stored in the flag to indicate a larger shift from Vpgm0 should be used for the magnitude of the initial programming pulse.

Figure 18:
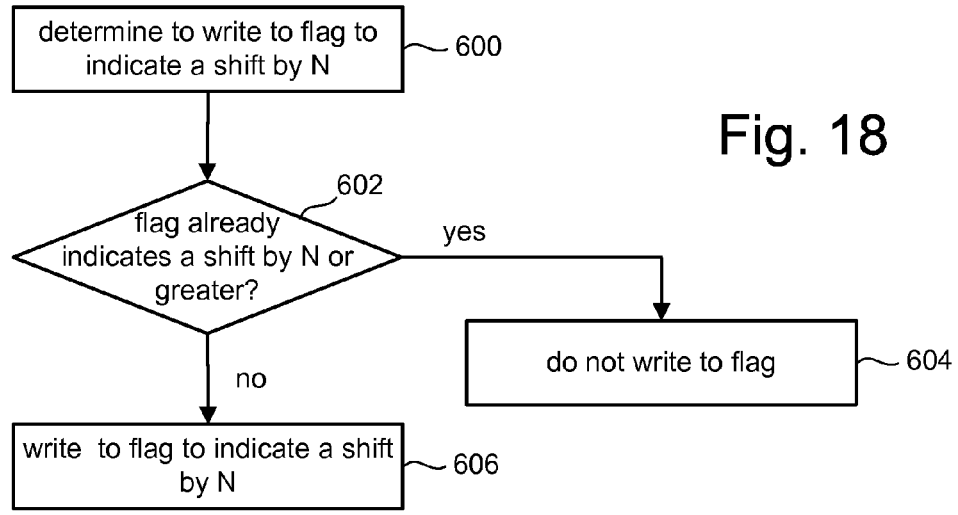
FIG. 18 is a flow chart describing one embodiment of a process for writing data to a flag.

FIG. 18 is a flow chart describing one embodiment of a process for writing to the flag bits. This embodiment prevents the flag from increasing the magnitude of the initial programming pulse. That is once a medium shift is used, the flag will not allow a small shift to be used. This way the initial magnitude of the program signal will stay the same or decrease but never increase. In other embodiments, other behaviors can be used. At step 600 of FIG. 18, it is determined that the flag needs to be written to indicate a particular shift from Vpgm0. In one embodiment, step 600 includes performing the processes of FIG. 14 or FIG. 17. In step 602, it is determined whether the flag already indicates a shift by that amount or greater. If so, the flag is not written to at step 604. If not, the flag is written to indicate the new shift from the Vpgm0.

Figure 19:
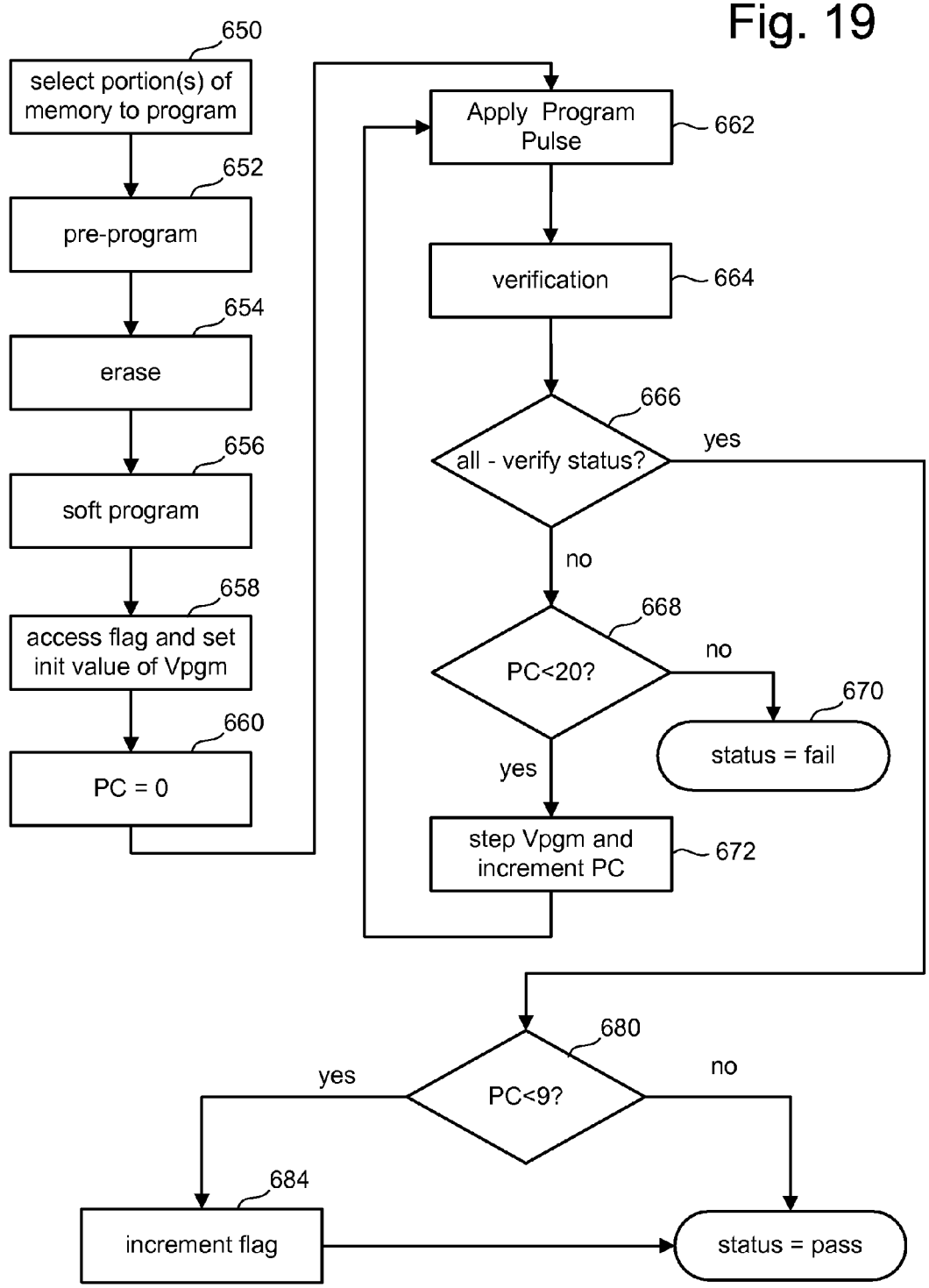
FIG. 19 is a flow chart describing one embodiment of a process for programming non-volatile storage.

FIG. 19 is a flow chart describing one embodiment of a process for programming non-volatile memory that counts a number of iterations in a programming cycle in order to determine how to set the magnitude of the initial programming pulse in a future programming cycle. Steps 650, 652, 654, 656, 658, 660, 662, 664, 666, 668, 670, and 672 of FIG. 19 are the same as steps 402, 406, 408, 410, 412, 414, 416, 418, 420, 424, 426, and 428 of FIG. 13, respectively. One difference is that after verification at step 664, if all the memory cells verify (step 666) then in step 680, it is determined whether the program count PC is less than 9. Step 662, 664, 666, 668, and 672 form a loop which is continually iterated until all the memory cells program or the program count reaches 20 (or a different number in other embodiments). If a number of iterations of that loop is less than 9, then a flag is incremented in step 684. If the number of iterations is not less than 9, then the process of programming completes without changing the flag. Each time the flag is incremented at step 684, the system will change (e.g. lower) the magnitude of the initial pulse of the programming signal. The flag is checked in step 658, the next time the process of FIG. 19 is performed. Thus, for example, if the magnitude of the initial programming voltage pulse is 16.9 volts, then the system will continue to use a program voltage signal where the initial pulse has a magnitude of 16.9 volts until the number of iterations needed to program the memory is less than 9. Once the number of iterations less than 9, then the flag will increment. The next time a programming process is performed, at step 658 the system will see that the flag has been incremented and will change the value of the magnitude of the initial program pulse from 16.9 down to 16.6. This will cause the number of iterations to rise up again. Eventually the number of iterations of the process of FIG. 19 will be less than 9 in which case the flag will be incremented and the initial pulse will have its magnitude lowered to 16.3, and so on. Note that in FIG. 19 the value of 9 in step 680 can be changed to other values.

FIG. 20 is a flow chart describing one embodiment of such a process that determines whether to lower the magnitude of the initial programming pulse based on the amount of errors detected during a previous read operation. The process of FIG. 20 is performed in response to a request to read data. In step 700, a normal read operation is performed for a page of data. This operation will be performed by various techniques known in the art. In step 702, error correction codes stored with the read data are checked to see whether there are any errors. If there are no errors, the data is reported in step 704. If there are errors, then in step 706 it is determined whether the errors are correctable. If the error is not correctable, then at step 708, an error is reported. If the error is correctable, then the error is corrected at step 710 and the data is reported at step 712. At step 714, the system determines whether the amount of error correction exceeded a threshold. One example of a threshold is whether more than 2 bits per sector had an error. Other thresholds can also be used. If the error exceeded that threshold, then the flag is incremented in step 718. If the error does not exceed the threshold, the flag will not be incremented. When the device is fresh, the flag is at zero. After the flag is incremented, the next time the programming process is performed the system will change the magnitude of the initial programming pulse. For example, the process of FIG. 13 can be used (without step 404) for programming. When performing step 412 the flag will be accessed and if it had been incremented since the last time it was accessed, the magnitude of the first program pulse will be one step below the previously used magnitude.

Although many of the examples for changing the programming parameters pertain to lowering the magnitude of the initial programming pulse, other parameters can also be changed. Additionally, other tasks can also be used to determine when to lower the magnitude of the initial pulse or otherwise change the programming parameters.

In an alternative embodiment, the program signal applied to the control gates/word lines can be of a waveform different than a set of pulses with increasing magnitudes.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:

1. A method for operating non-volatile storage, comprising:

programming non-volatile storage elements for multiple programming cycles using sets of programming pulses with a first initial magnitude;

reading data from non-volatile storage elements;

determining existence of one or more errors in the data from the reading of the data;

determining whether the one or more errors satisfy a threshold level;

continuing to program non-volatile storage elements using programming pulses with the first initial magnitude in response to determining that the one or more errors do not satisfy the threshold level; and programming non-volatile storage elements for multiple programming cycles using programming pulses with a second initial magnitude in response to determining that the one or more errors satisfy the threshold level, the second initial magnitude is different than the first initial magnitude.

2. The method of claim 1, wherein:

the reading data is performed in response to a read request; and the determining existence of one or more errors in the data is performed in response to the reading of data.

3. The method of claim 1, wherein:

the programming the set of non-volatile storage elements for multiple programming cycles programs one page of data during each cycle; and the reading data includes reading one page of data.

4. The method of claim 1, wherein:

the determining existence of one or more errors in the data is based on error correction codes.

5. The method of claim 1, further comprising:

correcting the one or more errors in the data.

6. The method of claim 5, wherein:

the determining whether the one or more errors satisfy the threshold level is based on the correcting of the one or more errors.

7. The method of claim 1, wherein:

the determining whether the error satisfies the threshold level includes determining whether more than a predetermined number of bits of the data are in error.

8. The method of claim 1, wherein:

the programming non-volatile storage elements for multiple programming cycles using programming pulses with the second initial magnitude is performed after the programming non-volatile storage elements for multiple programming cycles using sets of programming pulses with the first initial magnitude.

9. The method of claim 1, wherein:

the programming the set of non-volatile storage elements for multiple programming cycles using sets of programming pulses with the first initial magnitude and the continuing to program the non-volatile storage elements using programming pulses with the first initial magnitude are only performed prior to the programming of the set of non-volatile storage elements for multiple programming cycles using programming pulses with the second initial magnitude.

10. The method of claim 1, wherein:

the second initial magnitude is lower than the first initial magnitude.

11. A non-volatile storage system, comprising:

non-volatile storage elements; and one or more managing circuits in communication with the non-volatile storage elements, the one or more managing circuits program the non-volatile storage elements for multiple programming cycles using sets of programming pulses with a first initial magnitude, the one or more managing circuits read data from the non-volatile storage elements and determine existence of one or more errors in the data in response to the reading, the one or more managing circuits determine whether the one or more errors satisfy a threshold level, the one or more managing circuits continue to program the non-volatile storage elements using programming pulses with the first initial magnitude in response to determining that the one or more errors do not satisfy the threshold level, the one or more managing circuits program the non-volatile storage elements for multiple programming cycles using programming pulses with a second initial magnitude in response to determining that the one or more errors satisfy the threshold level and after programming using programming pulses with the first initial, the second initial magnitude is different than the first initial magnitude.

12. The non-volatile storage system of claim 11, wherein:

the reading data is performed in response to a read request;

the determining existence of one or more errors in the data is performed in response to the reading of data;

the second initial magnitude is lower than the first initial magnitude; and the non-volatile storage elements are NAND flash memory devices.

13. The non-volatile storage system of claim 11, wherein:

the one or more managing circuits correct the one or more errors in the data;

the one or more managing circuits determine existence of one or more errors in the data based on error correction codes; and the one or more managing circuits determine whether the one or more errors satisfy the threshold level based on the correcting the one or more errors.

14. The non-volatile storage system of claim 11, wherein:

the one or more managing circuits determine whether the one or more errors satisfy the threshold level by determining whether more than a predetermined number of bits are in error.

* * * * *